United States Patent [19]
Chang et al.

[11] Patent Number: 5,650,199
[45] Date of Patent: Jul. 22, 1997

[54] METHOD OF MAKING A MULTILAYER ELECTRONIC COMPONENT WITH INTER-LAYER CONDUCTOR CONNECTION UTILIZING A CONDUCTIVE VIA FORMING INK

[75] Inventors: Daniel H. Chang, Rancho Santa Fe; Arthur C. McAdams, Escondido; Xiangming Li, San Diego, all of Calif.

[73] Assignee: AEM, Inc., San Diego, Calif.

[21] Appl. No.: 562,158

[22] Filed: Nov. 22, 1995

[51] Int. Cl.$^6$ .................. B05D 3/04; B05D 5/12
[52] U.S. Cl. .................. 427/33; 427/97; 156/628.1; 216/17; 216/18; 216/39
[58] Field of Search .................. 427/79, 80, 97, 427/333, 407.1, 419.2; 156/628.1; 216/17, 18, 39, 83

[56] References Cited

U.S. PATENT DOCUMENTS

| | | | |
|---|---|---|---|
| 3,798,059 | 3/1974 | Astle et al. | 117/212 |
| 4,322,698 | 3/1982 | Takahashi et al. | 333/184 |
| 4,543,553 | 9/1985 | Takatsuki et al. | 336/83 |
| 4,731,297 | 3/1988 | Takaya | 428/553 |
| 5,032,815 | 7/1991 | Kobayashi et al. | 336/83 |
| 5,206,620 | 4/1993 | Watamabe et al. | 336/84 |

OTHER PUBLICATIONS

Miles Trainer Engineering Report, vol. I, Xerox Electro–Optical Systems, Apr. 22, 1981.

*Primary Examiner*—Shrive Beck
*Assistant Examiner*—Brian K. Talbot
*Attorney, Agent, or Firm*—Baker, Maxham, Jester & Meador

[57] ABSTRACT

A multilayered electronic component created by a wet process, wherein a ceramic base is imprinted with an electrode and an interlayer via is formed on top of it by introducing a via pattern printed in ink that is incompatible with a layer of wet ceramic slurry coating placed on top of the electrode and the via pattern. The incompatibility leads to a physical-chemical reaction that removes ceramic material away from the top of the via pattern by diffusing ceramic materials contained in a colloidal suspension forming a via-through hole. After the wet ceramic slurry is dried, it surrounds the via-through hole and the imprinted via pattern. Then a new electrode layer is imprinted on top of the dried ceramic coating. The new electrode layer completes an electrically conductive path formed from the bottom-most electrode layer, to the via pattern, and then terminating at the new electrode layer on top.

14 Claims, 1 Drawing Sheet

METHOD OF MAKING A MULTILAYER ELECTRONIC COMPONENT WITH INTERLAYER CONDUCTOR CONNECTION UTILIZING A CONDUCTIVE VIA FORMING INK

BACKGROUND OF THE INVENTION

1. Field of the Invention

This invention relates to the fabrication of electronic components, and more particularly, to a low cost, highly productive process of fabricating multilayer ceramic components with interlayer conductive-filled via holes.

2. Description of the Related Art

A variety of commercially available active electronic components have included multiple ceramic layers with interconnected circuits formed in each layer. In addition, hybrid circuits, integrated circuit packages, and transformers have been commercially available which have included multiple ceramic layers. Passive devices such as capacitors and inductors have also been commercially available which have included multiple ceramic layers.

There are several conventional methods of manufacturing multilayer ceramic components. Each requires the formation of thin layers of ceramic having the desired electrical properties and the delineation of a pattern or a matrix of patterns of conductive circuit pathways or electrodes between the layers of ceramic. Interconnection between the ceramic layers, when required, is provided by placing via holes in the layers at the desired locations and filling such via holes with conductive materials which contact the printed conductive circuit pathways to allow electron flow between the ceramic layers.

Typically, multilayer components consist of a bottom insulating layer of ceramic, one or more layers of ceramic with conductive circuitry applied to a top insulating layer of ceramic. Conductive circuitry may also be applied to the top surface.

There are several steps common to conventional methods of manufacturing multilayer ceramic components. One major step is to form a ceramic base. It is desirable to start with a uniform mix of ceramic constituents which is free from impurities or bubbles caused by trapped gases. Another major step is the deposition of the conductive electrode circuit pathway pattern onto the ceramic base. This requires compatibility between the electrode chemistry and the ceramic composition chemistry. Where screen printing techniques are used, compatibility is typically achieved by the proper selection of the electrode ink used to print the circuit pattern. It is necessary to dry the printed patterns without contamination, smearing or distortion.

For components requiring interlayer connection another major step involves forming a via to provide electrically connectivity of the electrode to other electrodes in additional circuit layers. Via holes must be correctly positioned to match the circuit pathways. They must have a fairly consistent diameter and must be free from debris internally or externally. The ceramic material around the via holes must be free from stress that might induce distortion or cracking. Once the via through-holes are formed they must be filled with conductive material.

Still another important step involves the stacking of layers of ceramic material imprinted with the electrode circuit pattern. During this step, the electrode patterns must be vertically aligned without being distorted. The stacking must be done in a delicate manner to prevent damage to the ceramic material. Air must not be trapped between the alternating layers of ceramic material and electrodes. A top layer of ceramic equivalent to the ceramic base may also be required in the design of some components.

Generally, monolithic multilayer electronic components may be built according to either of two types of processes. One process is known as a "tape process" whereby ceramic slurry is cast into a thin film and dried to form a ceramic tape. Multiple sheets of the ceramic tape may be stacked to form the ceramic base and top layers. Each conductive circuit pathway layer is printed on a ceramic tape surface and then a plurality of such tape surfaces along with the base and top layers, are registered, stacked and laminated together.

In a tape process, a ceramic slurry is cast onto a thin film of tape that is carried on a substrate, such as steel belt or polymer film. The dried tape is stripped from the substrate. A printed circuit path is printed on the tape, and then a monolithic circuit is formed by stacking several such printed tape circuits one on top of another to form a multilayer construction. The tape layers are laminated together by applying heat and pressure. To electrically interconnect the layers vias are formed by making holes in each tape layer. The holes are typically formed with a mechanical punch or a laser prior to printing the electrode and prior to stacking. The holes must then be filled with some conductive material to form a conductive path between adjoining layers.

In a typical tape process for manufacturing multilayer components with interconnecting conductive layers discrete equipment and discrete operations are required for casting, stripping, via formation, printing, stacking and laminating.

In a "wet process", ceramic slurry is cast and dried on a rigid substrate to form the ceramic base. A printed circuit made of conductive material is printed on the base and dried. The next layer of slurry is cast on top of the first layer, dried and printed with an electrical circuit. This process is repeated until the desired number of layers have been formed at which point the top ceramic layers are cast. An advantage of this process is that only two operations are required, namely casting and printing and these operations are easily combined and automated in a single machine resulting in reduced labor costs, increased automation and productivity. However, when conductive vias must be placed between adjoining circuit layers, the wet process has been of limited value. Prior art techniques have resorted to screen printing of the ceramic slurry as opposed to casting of the slurry so that suitable openings in the ceramic layer could be formed to serve as vias. These techniques require numerous screen printers and have resulted in a process which is much slower and much more difficult to control the quality of the vias, thereby negating the inherent advantages of a wet process.

It would clearly be an advancement of the art to gain the productivity advantage of the wet process in the manufacturing of multilayer components which require conductive vias between layers.

SUMMARY OF THE INVENTION

An objective of this invention is to overcome the limitations of the prior art described above in the creation of multilayered electronic components having interconnecting vias between layers. In accordance with achieving this objective and others that will become apparent upon reading this specification, this invention discloses a novel process for creating a multilayer electronic component having the productivity advantages of a wet process without requiring screen printing of the ceramic slurry. In our process, a conductive pattern is printed onto the ceramic base which has been formed by the conventional wet process. At predetermined locations, where an interlayer electrical connection or via is desired, a via pattern is printed on top of the previously printed conductive circuit utilizing a conductive ink specially formulated to be chemically incompatible with the ceramic slurry. A wet ceramic slurry layer is applied as a coating on top of the above-described combination. Due to the incompatibility, a physical-chemical interaction between the slurry and the conductor ink in the via pattern destroys the colloidal system of the ceramic slurry and forms a via through-hole in the area above the connector pattern.

After the ceramic slurry has dried, a conductive pattern is printed on top to complete the inter-layer connection or via. Other layers may be added by repeating the printing and coating steps until the monolithic multilayered circuit is complete. By creating the vias by the unique process of this invention, substantial advantages are obtained over the prior art. Such advantages include obviating the need for lamination or stacking of multilayers of ceramic having electrodes imprinted thereon. Another advantage is that the substantial manufacturing efficiency of wet processing is fully available without the need for interruptions required by prior art techniques which include using screen printing of the ceramic slurry or hole-punching means to open via-through holes in dried ceramic slurry material.

BRIEF DESCRIPTION OF THE DRAWINGS

The objects, advantages and features of the present invention will be more clearly understood by reference to the following detailed disclosure when read in conjunction with the accompanying drawing, in which.

DETAILED DESCRIPTION OF THE PREFERRED EMBODIMENTS

Figure 1:
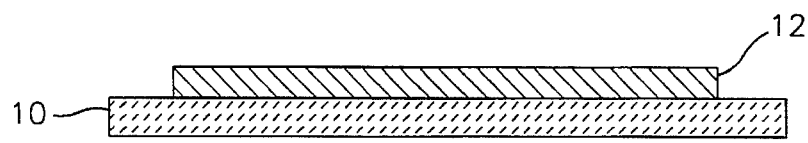
FIG. 1 illustrates a ceramic base formed with an electrode printed thereon.

Unless otherwise indicated, all percentages herein are by weight.

This invention is described with reference to a preferred embodiment shown in the drawing figures. In these figures, a like number shown in various figures represents the same or similar elements in each figure. While this invention is described in terms of the best mode for achieving this invention's objectives, it will be appreciated by those skilled in the art that variations may be accomplished in view of these teachings without deviating from the spirit or scope of the invention.

FIG. 1 illustrates a ceramic base 10 formed of dried ceramic slurry. The ceramic base may be created by mixing a ceramic powder with a polymer resin and suitable solvents to form a slurry. This slurry may be deposited onto a carrier (not illustrated) that provides strength for supporting multiple layers of ceramic using a known wet process techniques such as "doctor blading" or "curtain coating." The chemical composition of the base layer 10 is not critical to enabling this invention. It is only important that the ceramic base 10 has adequate dielectric properties, is compatible with the conductor ink used to create a circuit pathway or electrode 12 and is compatible with or identical to the slurry used for via formation. Accordingly, the ceramic base 10 may comprise conventional composition having constituents such as Aluminum oxide, Aluminum nitride or Barium titanate based formulations. As is conventional, the polymer resin may comprise of an acryloid polymer or polyvinyl butyral, or another suitable polymer composition.

Preferably, the electrode ink used to print the electrode 12 consists essentially of conductive metal particles, surfactants, binders, plasticizers and solvents in suitable proportions to form a conductive paste with the desired rheology and which is compatible with the ceramic base. Preferably, this electrode ink comprises about 30–90% electrically conductive metal, and about 10–50% solvents, binders, and additives such as aliphatic and aromatic hydrocarbons, acrylic resins, and cellulose and its derivatives. Electrically conductive metals that are proper for this ink include Copper, Tungsten, Nickel, Silver, Gold, Palladium, and Platinum. The conductive pattern of electrode 12 may be printed onto the ceramic base with conventional printing techniques such as screen printing, or stencil printing and then allowed to dry.

Figure 2:
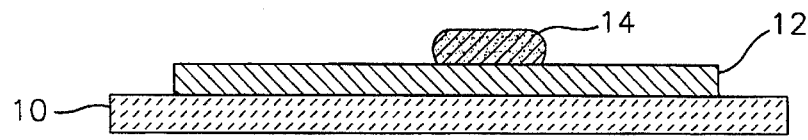
FIG. 2 illustrates ceramic base and electrode of FIG. 1 with a via pattern primed thereon.

Referring to FIG. 2, a via pattern 14 is formed on the printed circuit or electrode at locations where interconnecting vias are desired. The via pattern is printed with a special formulation of via conductor ink which is chemically incompatible with a ceramic slurry mixture that is to be applied over the via pattern to form the base ceramic for a new circuit layer. The printing of the via pattern may be accomplished with conventional printing techniques such as screen printing, stencil printing and ink jet techniques. By choosing a via conductor ink that is incompatible with such a slurry mixture, the inventors have created a way to form via connections in multilayer electronic components during wet processing while avoiding prior art requirements for multiple screen printers as discussed in the background. Thus, for the first time the productivity advantages of wet processing can be enjoyed without suffering the interruptions and extra punching or drilling steps of the prior art in order to establish vias.

Preferably, the via conductor ink comprises about 40–90% metal, such as Copper, Nickel, Silver, Palladium, or Platinum and about 10–50% of solvents, binders and additives. These solvent, binders, and additives, comprise the constituents of the ink that are incompatible with the slurry and may include toluene, mineral spirits, other aliphatic and aromatic hydrocarbons, modified acrylic resins, cellulose and its derivatives.

Figure 3:
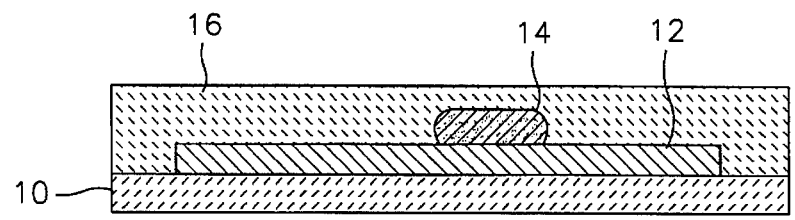
FIG. 3 illustrates the combination of FIG. 2 with an applied coating of a wet ceramic slurry that is incompatible with the ink used to print the via pattern of FIG. 2.

FIG. 3 shows a wet ceramic slurry coating 16 applied over the electrode 12 and the via pattern 14 to form a ceramic base for another electrode forming a new circuit layer. The inventors have recognized that is important to prevent the via conductor ink used to create the via pattern from fully drying before the ceramic slurry coating is applied. Keeping the ink wet ensures that a desired physical-chemical interaction due to the incompatibility of the via conductor ink and the ceramic slurry occurs.

The inventors have also recognized that the ceramic slurry consists essentially of a suspension mixture of solid ceramic materials that are suspended in a solvent. The inventors have taken advantage of the suspension nature of the slurry by carefully selecting a via conductor ink that is incompatible with the colloidal system of the slurry. When the wet ceramic coating is applied, the solvent/binder constituents of the via conductor ink diffuse out and destroy this colloidal system. Thus, when a portion of the ceramic slurry comes into contact with the via conductor ink, this pre-selected incompatibility condition causes the ceramic particles to diffuse from the suspension and cling to other ceramic materials.

Figure 4:
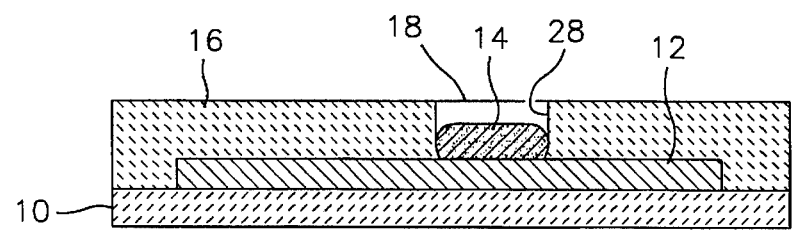
FIG. 4. illustrates a via being formed by a physical-chemical interaction between the wet ceramic slurry and the incompatible ink of the via pattern.

Referring to FIG. 4, the ceramic particles in the coating are forced away from the surface of the via pattern forming via 18 in accordance with the physical-chemical interaction discussed above. Generally, the ceramic particles move away from the via conductor ink and an area with clear solvent begins forming in area bounded on the bottom by the via pattern 14 and around the circumferential sides 28 created by the ceramic slurry encircling the via pattern.

The inventors have recognized that it is important to select the ceramic slurry composition so that it complements the desired incompatible relationship with the via conductor ink but is also compatible with the ink used to create electrode 12. In other words, it is the incompatibility between the via conductor ink of the pattern 14 and the slurry 16 that creates the physical-chemical interaction that forms the via 18 above the via pattern 14 but the electrode 12 must not be adversely affected by the slurry. Preferably, the ceramic slurry 16 comprises about 50–80% ceramic; about 1–15% plastic resin; about 0.1–5% plasticizer; about 0.1%–2.5% surfactant; and about 20–40% solvent.

Particularly good choices of constituents to achieve the above-described composition of the ceramic slurry include enough alumina or ferrite to achieve the above-referenced ratio. Good material choices to achieve the preferred ratio of plastic resin include cellulose and its derivatives, polyalkylene carbonates, acrylic resins, and polyvinyl butyral. If plasticizers are included above a 0% ration, then they may be selected from the group consisting of dioctyl phthalate, diisodecyl adipate, and derivatives of either.

Surfactants may be selected from the group having octylphenol ethoxylate, block copolymers of ethylene oxide and propylene oxide, and ammonium polyelectrolyte. The solvent composition may include the following constituents, alcohol, cyclohexanone, acetate, water, and diisodecyl ketone.

Figure 5:
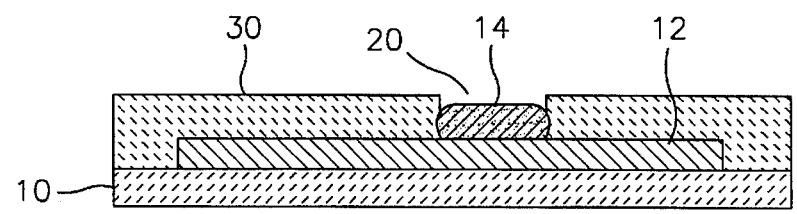
FIG. 5 illustrates a via through-hole established above the via pattern by the interaction shown in FIG. 4 and the via through-hole being surrounded by dried ceramic material that results from drying the wet ceramic slurry.

FIG. 5 illustrates the stage of our process when the slurry coating 16 is dried and the via pattern 14 containing conductive metal particles is surrounded by dried ceramic material forming another ceramic layer 30. Also surrounded by the ceramic material is the opening described above and that is bounded on the bottom by the via pattern 14. After drying the slurry, a via-hole 20 exists where this opening had been formed. At this stage, the via 18 is incomplete and includes via pattern 14 formed of via conductor ink and the via through-hole 20. The via 18 is incomplete at this stage because it needs to have its path connected to the next electrical circuit layer which has not been provided at this stage.

Figure 6:
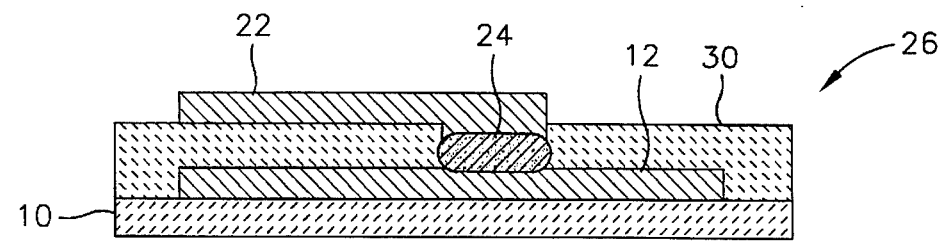
FIG. 6 illustrates the via connection located between the ceramic base and a new ceramic layer created by the dried ceramic material of FIG. 5 and being completed by an electrode being printed on the new ceramic layer.

Referring to FIG. 6, the process of forming at least two connected circuit layers is complete when another electrode 22 is formed by printing a conductive circuit on top of the dried ceramic slurry layer. The printing of electrode 22 electrically completes the via 18 and provides a conductive path between circuit layers providing a through-hole connection 24. The printing that forms electrode 22 may be performed in any well-known way, such as the screen printing and stencil printing techniques described above. It is preferable to use electrode ink of the same chemical composition as that described above for the printing the electrode 12 to ensure compatibility with the ceramic layer. Once the electrode 22 if formed, additional vias and circuit layers may be performed by repeating the steps described above with reference to FIGS. 2–5 until the desired number of circuit layers have been created. When repeating the steps, it is preferable to use the same via conductor ink and ceramic slurry compositions as that described above, also with reference to FIGS. 2–5.

By carrying out the above-described process and a firing process a monolithic multilayered electronic component, such as the monolithic circuit component 26 shown in FIG. 6, can be created while maintaining the productivity advantage of wet processing. Such a multilayer electronic component may be further processed for use in such applications as chip inductors, chip transformers, ceramic integrated circuit packages, and hybrid circuits.

Accordingly, a unique monolithic multilayered electronic component and a method of making the same has been described. While various embodiments of constituents and materials have been disclosed, it should be apparent that variations and alternative embodiments may be apparent to those skilled in the art in view of the teachings herein. It is understood, therefore, that the invention is not to be in any way limited except in accordance with the spirit and scope of the appended claims and their equivalents.

We claim:

1. A method for forming at least one interlayer via in a multilayer electronic component, comprising the steps of:

(a) printing a first electrode on a first ceramic layer with a conductive electrode ink creating a first circuit layer;

(b) printing a via pattern on the first electrode with a conductive via forming ink;

(c) coating the electrode and the printed via pattern with a wet ceramic slurry comprising ceramic constituents suspended in a solvent, the slurry characterized as being chemically incompatible with the via forming conductive ink whereby the ceramic constituents diffuse out of the solvent thereby forming an area of solvent adjacent the via pattern;

(d) drying the slurry to create a via through-hole in the area of solvent; and (e) printing a second electrode on the dried slurry above the via-through hole thereby creating a second circuit layer and also providing an electrical interconnection between the first and second circuit layers.

2. The method of claim 1, wherein multiple circuit layers having at least one via interconnecting each circuit layer may be created by repeating steps (b) through (e) in a cyclical fashion and substituting the electrode created in step of (e) of the most previous cycle to become the first electrode referenced in step (a).

3. The method of claim 1, wherein the ceramic slurry comprises about 50–80% ceramic material; about 1–15% plastic resin; about 0.1–5% plasticizer; about 0.1%–2.5% surfactant; and about 20–40% solvent.

4. The method of claim 3, wherein the ceramic material is selected from the group consisting of alumina boron carbide, silicon carbide, ferrite and aluminum nitride.

5. The method of claim 3, wherein the plastic resin is selected from the group consisting of cellulose and its derivatives, polyalkylene carbonates, acrylic resins, and polyvinyl butyral.

6. The method of claim 3, wherein the plasticizer is selected from the group consisting of dioctyl phthalate and its derivatives, and diisodecyl adipate and its derivatives.

7. The method of claim 3, wherein the surfactant is selected from the group consisting of octylphenol ethoxylate, block copolymers of ethylene oxide and propylene oxide, and ammonium polyelectrolyte.

8. The method of claim 3, wherein the solvent is selected from the group consisting of ethyl, propyl and butyl alcohols, toluene, butyl and propyl acetates, water and diisobutyl ketone.

9. The method of claim 1, wherein the electrode ink used for the first electrode comprises about 40–90% electrically conductive metal, and 10–50% solvents, binders, and additives.

10. The method of claim 9, wherein the solvents, binders, and additives are selected from the group consisting of aliphatic and aromatic hydrocarbonism, acrylic resins, cellulose and its derivatives.

11. The method of claim 9, wherein the electrically conductive metal is selected from the group consisting of Copper, Nickel, Tungsten, Silver, Gold, Palladium, and Platinum.

12. The method of claim 1, wherein the via forming ink comprises about 40–90% electrically conductive metal, and 10–50% solvent, binders, and additives.

13. The method of claim 12, wherein the solvents, binders, and additives are selected from the group consisting of toluene, mineral spirits, other aliphatic and aromatic hydrocarbons, modified acrylic resins, cellulose and its derivatives.

14. The method of claim 13, wherein the electrically conductive metal is selected from the group consisting of Copper, Nickel, Tungsten, Silver, Gold, Palladium, and Platinum.

* * * * *